(12) United States Patent
Xie et al.

(10) Patent No.: US 11,164,782 B2
(45) Date of Patent: Nov. 2, 2021

(54) SELF-ALIGNED GATE CONTACT COMPATIBLE CROSS COUPLE CONTACT FORMATION

(71) Applicant: International Business Machines Corporation, Armonk, NY (US)

(72) Inventors: Ruilong Xie, Niskayuna, NY (US); Balasubramanian S Pranatharthi Haran, Watervliet, NY (US); Dechao Guo, Niskayuna, NY (US); Nicolas Loubet, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 16/735,861

(22) Filed: Jan. 7, 2020

(65) Prior Publication Data
US 2021/0210384 A1     Jul. 8, 2021

(51) Int. Cl.
*H01L 21/768*     (2006.01)
*H01L 23/522*     (2006.01)
(Continued)

(52) U.S. Cl.
CPC .... *H01L 21/76897* (2013.01); *H01L 23/5226* (2013.01); *H01L 23/53257* (2013.01); *H01L 27/1104* (2013.01); *H01L 29/456* (2013.01)

(58) Field of Classification Search
CPC .......... H01L 21/76897; H01L 23/5226; H01L 23/53257; H01L 27/1104; H01L 29/456
(Continued)

(56) References Cited

U.S. PATENT DOCUMENTS

| 8,772,165 B2 | 7/2014 | Kim |
| 9,379,058 B2 | 6/2016 | Song |

(Continued)

FOREIGN PATENT DOCUMENTS

| CN | 1139985 C | 2/2004 |
| EP | 0437306 A2 | 7/1991 |
| EP | 1205980 A1 | 5/2002 |

OTHER PUBLICATIONS

James, Dick, "A Quick Look at 14-nm and 10-nm Devices", NCCAVS Junction Technology Group, Updates on New Technologies & Devices: 2018, Friday, Jul. 13, 2018, 28 pages.

*Primary Examiner* — Tu-Tu V Ho
(74) *Attorney, Agent, or Firm* — David K. Mattheis; Maeve M. Carpenter

(57) ABSTRACT

A method of fabricating a semiconductor device includes forming a plurality of semiconductor fins upon a substrate, forming a plurality of epitaxially grown source-drain regions upon the fins, forming a plurality of device gates upon the fins, the device gates disposed between the epitaxially grown source-drain regions, forming a trench exposing at least one epitaxially grown source-drain region, masking at least a portion of the exposed epitaxially grown source-drain region, forming a gate trench exposing at least a portion of a device gate and gate spacer, forming a metallization layer between the epitaxially grown source-drain region and the device gate, selectively recessing the metallization layer, forming a conductive layer upon the metallization layer, and forming a dielectric cap above the conductive layer.

19 Claims, 10 Drawing Sheets

(51) Int. Cl.
*H01L 27/11* (2006.01)
*H01L 23/532* (2006.01)
*H01L 29/45* (2006.01)

(58) Field of Classification Search
USPC .......................................................... 257/213
See application file for complete search history.

(56) References Cited

U.S. PATENT DOCUMENTS

| | | |
|---|---|---|
| 9,461,143 B2 | 10/2016 | Pethe |
| 9,570,573 B1 | 2/2017 | Fan |
| 9,929,048 B1 | 3/2018 | Xie |
| 10,074,564 B2 | 9/2018 | Chanemougame |
| 2003/0049918 A1* | 3/2003 | Shen ................ H01L 21/76897 438/586 |
| 2005/0026412 A1 | 2/2005 | Drynan |
| 2011/0084320 A1* | 4/2011 | Jung ................ H01L 21/76834 257/288 |
| 2011/0227136 A1* | 9/2011 | Park ................ H01L 21/76895 257/288 |
| 2016/0359009 A1 | 12/2016 | Xie |
| 2017/0110549 A1 | 4/2017 | Xie |
| 2018/0166385 A1* | 6/2018 | Liang ................ H01L 21/76814 |

\* cited by examiner

SELF-ALIGNED GATE CONTACT COMPATIBLE CROSS COUPLE CONTACT FORMATION

BACKGROUND

The disclosure relates generally to semiconductor devices including self-aligned gate contacts (SAGC). The disclosure relates particularly to semiconductor devices including self-aligned gate contacts having cross-couple-contacts.

An SAGC (self-aligned gate contact) is a semiconductor device fabrication element wherein the gate contact of a field effect transistor is placed over the transistor source-drain (S-D) regions, or the gate contact at least slightly overlaps the S-D (source-drain) regions of the device. Self-aligned gate contacts are attractive to device designers as they enable the free placement of gate contacts without shorting the gate to the S-D regions. This in turn enables more flexibility in the device designs in terms of device cell height scaling. However, the self-aligned gate contact process is not naturally compatible with static random-access memory (SRAM) cross-couple contacts as the SRAM process aims to short the gate with S-D.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a method of fabricating a semiconductor device includes forming a plurality of semiconductor fins upon a substrate, forming a plurality of epitaxially grown source-drain regions upon the fins, forming a plurality of device gates upon the fins, the device gates disposed between the epitaxially grown source-drain regions, forming a trench exposing at least one epitaxially grown source-drain region, masking at least a portion of the exposed epitaxially grown source-drain region, forming a gate trench exposing at least a portion of a device gate and gate spacer, forming a metallization layer between the epitaxially grown source-drain region and the device gate, selectively recessing the metallization layer, forming a conductive layer upon the metallization layer, and forming a dielectric cap above the conductive layer.

In one aspect, a method of fabricating a semiconductor device includes forming a trench exposing an epitaxially grown source-drain region, masking at least a portion of the exposed epitaxially grown source-drain region, forming a gate trench exposing at least a portion of a device gate and gate spacer, forming a metallization layer between the epitaxially grown source-drain region and the device gate, selectively recessing the metallization layer, forming a conductive layer upon the metallization layer, and forming a dielectric cap above the conductive layer.

In one aspect, a semiconductor device having self-aligned gate contacts includes an electrical connection between a device gate and a source-drain region, the electrical connection including a lower component disposed over the source-drain region and a recessed spacer region, and an upper component disposed over the device gate metal and the lower component.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
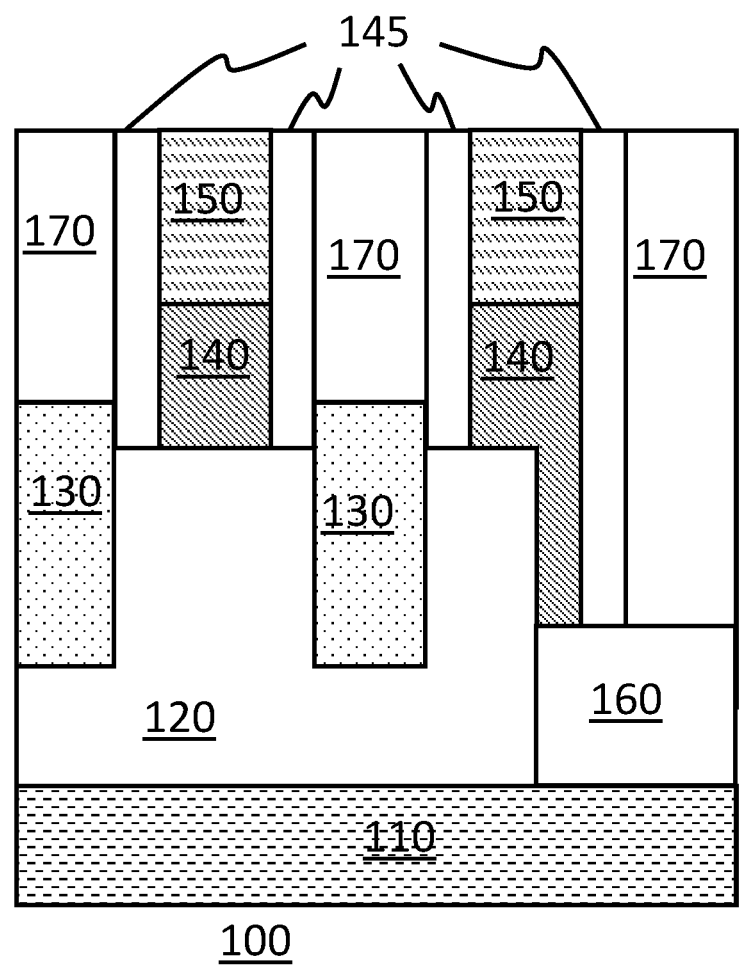
FIG. 1 provides a cross-sectional view of a step in the fabrication of a semiconductor device, according to an embodiment of the invention. The figure illustrates a device after the formation of fins upon a substrate. the figure further illustrates the epitaxially grown source-drain regions, gate structures—including gate sidewall spacers and gate hard mask sacrificial caps, of the device. The figure also illustrates patterning material disposed above the epitaxially grown source-drain regions and shallow trench isolation (STI) material.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features, and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Static random-access memory (SRAM) structures require a cross-contact (XC) between device source-drain (S-D) regions and device gate regions. The XC can be achieved by forming a source-drain contact (CA) to gate contact (CB) XC. Such a CA-CB XC connection can impact the metal zero (M0) line of the device and make device wire routing less flexible, impacting the scaling of the SRAM devices. Alternatively, the CA-CB XC connection can be formed using a separate mask and etching process, although this may result in a thin, and therefore weak, XC connection between the CA and CB points. Such a thin and weak CA-CB XC connection can impact device reliability and longevity. Disclosed embodiments of the invention provide a robust CA-CB XC connection for the SRAM device.

In an embodiment, the CA-CB XC connection is embedded in the device and formed from two components. The first component, a trench silicide layer is formed between the S-D and gate contact areas. Trimming of the first component can result in a thin or incomplete contact layer, susceptible to failure in the device. After the trimming of the first component, a second conductive component is selectively grown upon the first component resulting in a more robust CA-CB XC element.

This description and the accompanying figures illustrate the non-limiting use of the methods of an embodiment of the invention in the fabrication of a fin field effect transistor (FINFET). The methodology of the invention may be applied in the fabrication of other semiconductor devices including but not limited to planar FET, nanosheet, and nanowire semiconductor devices.

As provided in FIG. 1, at the illustrated point in the fabrication of device 100, fins 120 have been formed upon substrate 110 using any technique suitable in the art, including photoresist/hard mask patterning and etching, sidewall image transfer (SIT), etc. The semiconductor substrate 110 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

S-D regions 130, are epitaxially grown upon fins 120, typically orthogonal to the fins 120 of the device. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In an embodiment, S-D regions 130 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Wet or dry etching methods form trenches between fins, followed by the deposition of dielectric fill and then recessing for STI 160 formation to isolate portions of the device from each other.

In an embodiment, dummy gate structures are also formed upon the fins, typically also orthogonal to the fins. The dummy gate structures are subsequently replaced with actual gate structures using a replacement metal gate (RMG) process. The RMG structures 140 of the figure, include a high-k dielectric layer and work function metal layer. In an embodiment, one or more of: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof where each value of x is independently from 0.5 to 3 and each value of y is independently from 0 to 2 is used to form the high-k layer. One or more work function metal layers, such as TiN or TiC, for example, follows the high-k dielectric layer. After that, conductive metal fill material, such W, can be used to fill the remaining space in the gate. Device fabrication also includes forming dielectric sidewall spacers 145, between the replacement metal gate (RMG) stacks and the S-D regions.

Inter-layer dielectric (ILD) 170 is disposed above the S-D and STI 160 regions and chemical mechanical planarization methods produce a substantially flat surface from which the next steps proceed.

After gate metal planarization, a gate recess step can be performed to recess the gate below the ILD 170. After that, Deposition of a self-aligned contact cap material or hard mask 150 above the RMG structure 140, and between sidewall spacers 145, provides protection for the RMG during subsequent fabrication steps.

Figure 2:
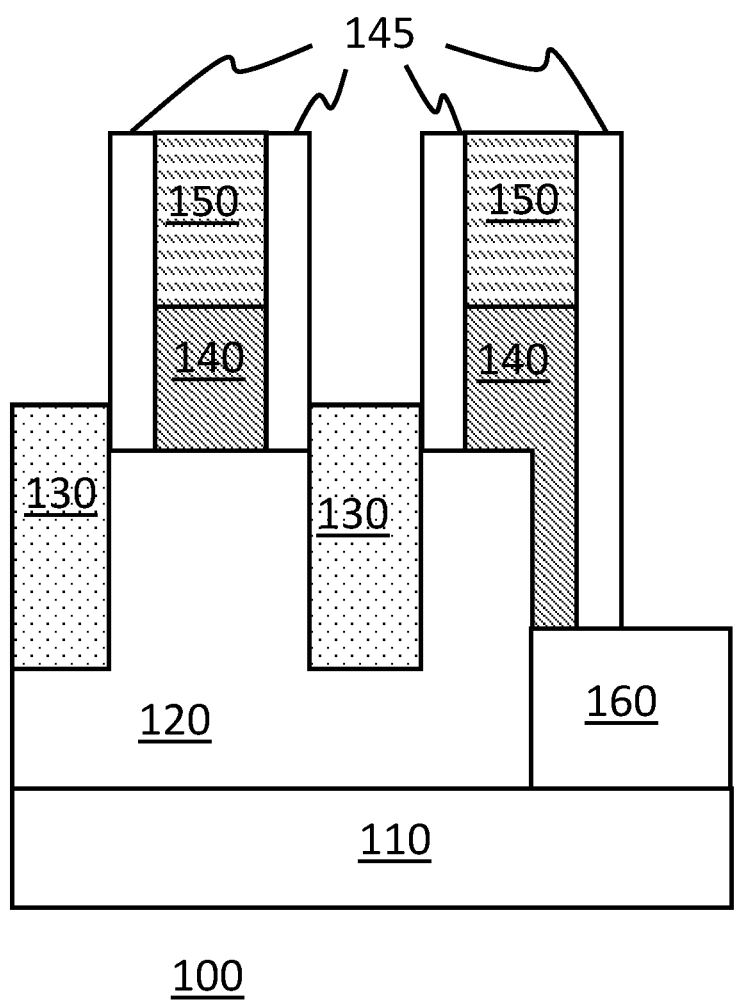
FIG. 2 provides a cross-sectional view of a step in the fabrication of a semiconductor device, according to an embodiment of the invention. The figure illustrates the device after removal of the patterning material from above the source-drain regions and shallow trench isolation (STI) material.
Figure 3:
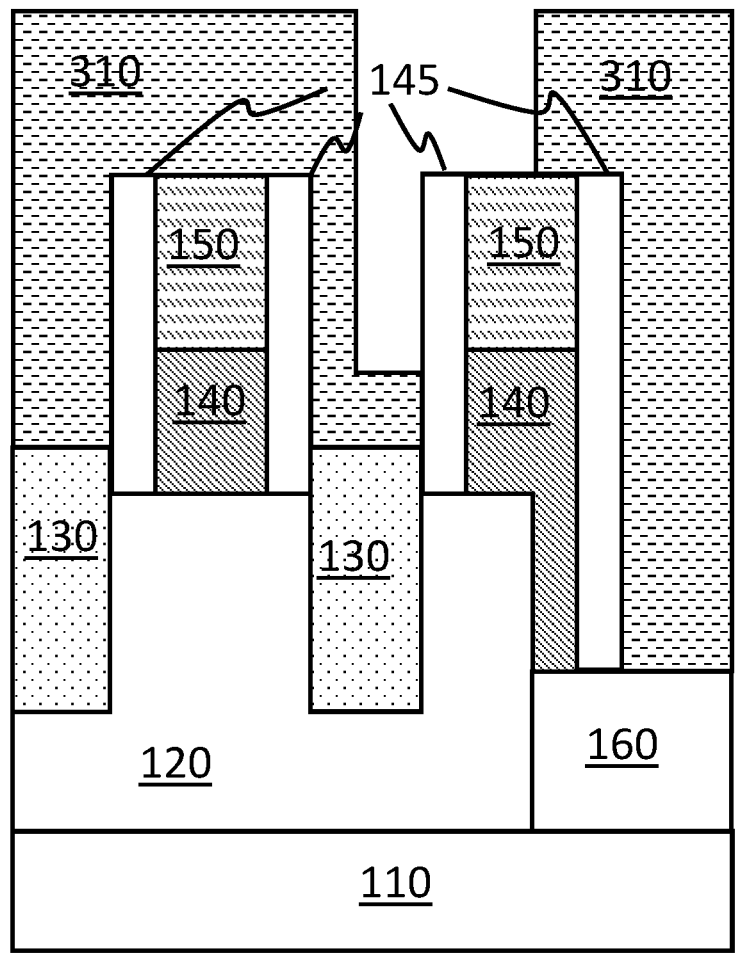
FIG. 3 provides a cross-sectional view of a step in the fabrication of a semiconductor device, according to an embodiment of the invention. The figure illustrates the device after the masking of the S-D regions and the formation of a trench exposing device gate hard mask and sidewall spacer portions. In an embodiment (not shown), the S-D regions are only partially masked, leaving a portion of the upper surface of S-D region 130 exposed after the trench formation.

As shown in FIG. 2, a patterning mask (not shown) is used to define regions where S/D XC connections are going to be formed. SAGC etching follows the masking to remove ILD 170, exposing the S-D regions 130 and STI 160 regions. As shown in FIG. 3, deposition of a spin-on coating of an organic planarization layer (OPL) material 310, together with lithographic masking and etching processes, mask portions of device S-D regions 130 while exposing portions of the hard mask 150 and sidewall spacers 145.

Figure 4:
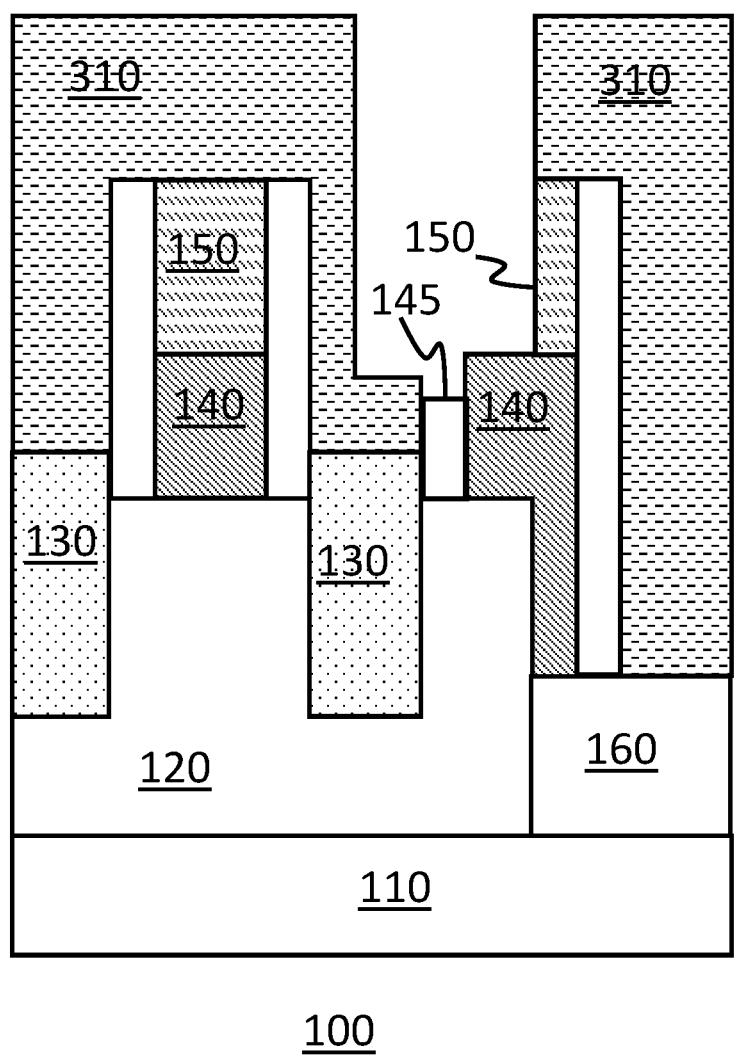
FIG. 4 provides a cross-sectional view, of a step in the fabrication of a semiconductor device, according to an embodiment of the invention. The figure illustrates the device after the selective etching of the gate hard mask and sidewall spacer portions.
Figure 5:
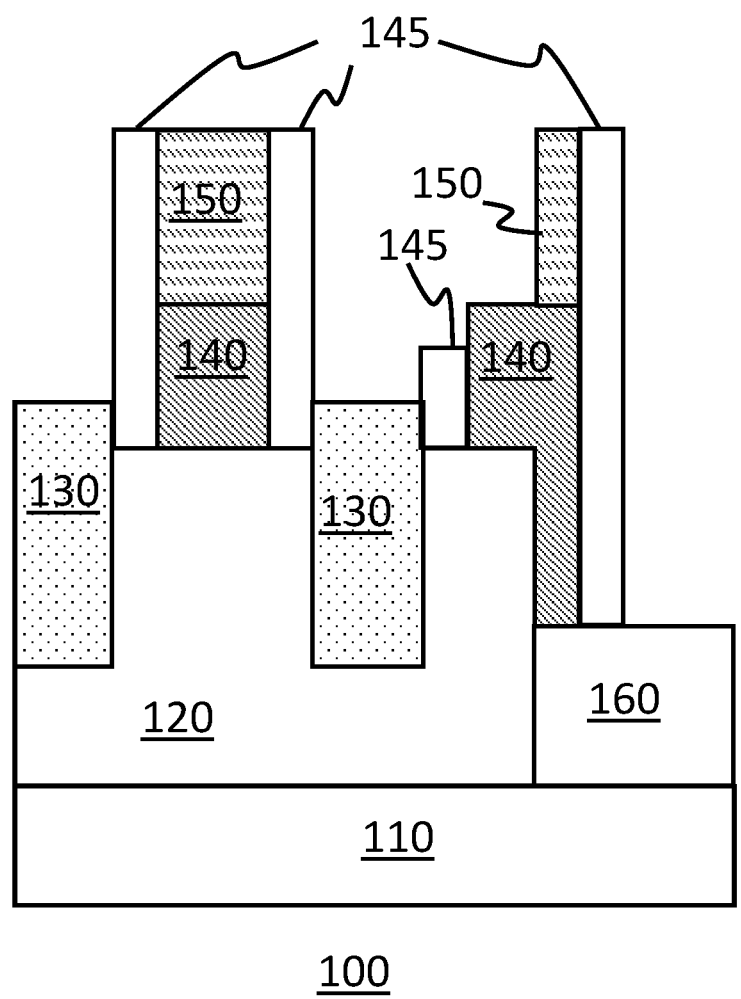
FIG. 5 provides a cross-sectional view of a step in the fabrication of a semiconductor device, according to an embodiment of the invention. The figure illustrates the device after the ashing of the masking material.

As shown in FIG. 4, a reactive ion etching (RIE) process step removes portions of the hard mask 150, RMG structure 140 and sidewall spacers 145 in preparation for the formation of the CA-CB XC connection. As shown in FIG. 5, an ashing step results in the removal of the OPL material 310, exposing the S-D region 130 in addition to the sidewall spacer 145 and RMG structure 140. As shown in the figure, the upper surface of the exposed RMG structure 140 is disposed above the upper surface of the S-D region 130 requiring the intended CA-CB XC connection to bridge both horizontal and vertical gaps between the S-D region 130 and RMG structure 140 device portions. In this embodiment, the upper surface of RMG structure 140 is disposed at a first height above the fins 120 and the upper surface of the S-D region 130 is disposed at a second height above the fins 120.

The first height of the RMG structure 140 is greater, or further from fins 120, than the second height of the S-D region 130.

Figure 6:
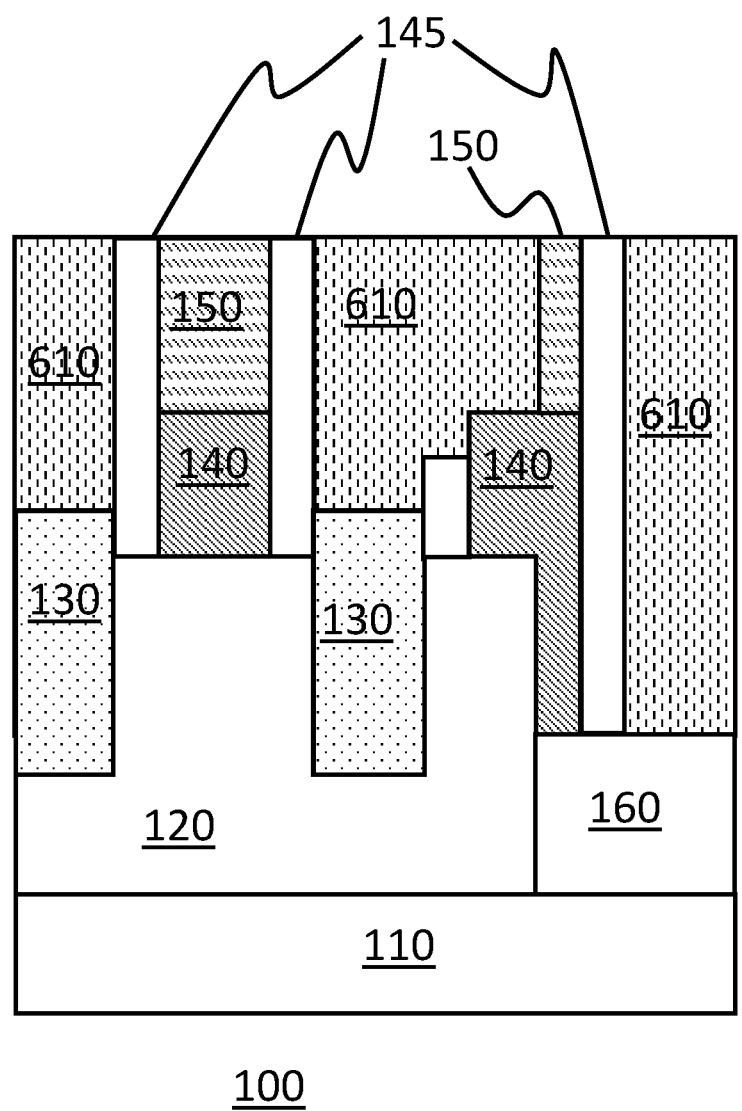
FIG. 6 provides a cross-sectional view of a step in the fabrication of a semiconductor device, according to an embodiment of the invention. The figure illustrates the device after the formation of a trench silicide layer upon the S-D region and gate work function metal.

As shown in FIG. 6, a trench silicide (TS) process yields a metallized layer 610 adjacent to and above the S-D region 130, sidewall spacer 145, and RMG structure 140. In an embodiment, formation of the trench silicide layer 610 includes forming a silicide layer between contact and epi (e.g., Ni silicide, Ti silicide, NiPt silicide, Co silicide, etc.) followed by forming metallization materials above the silicide (e.g., a thin adhesion metal such as TiN and a bulk metal fill such as Co, and CMP).

Figure 7:
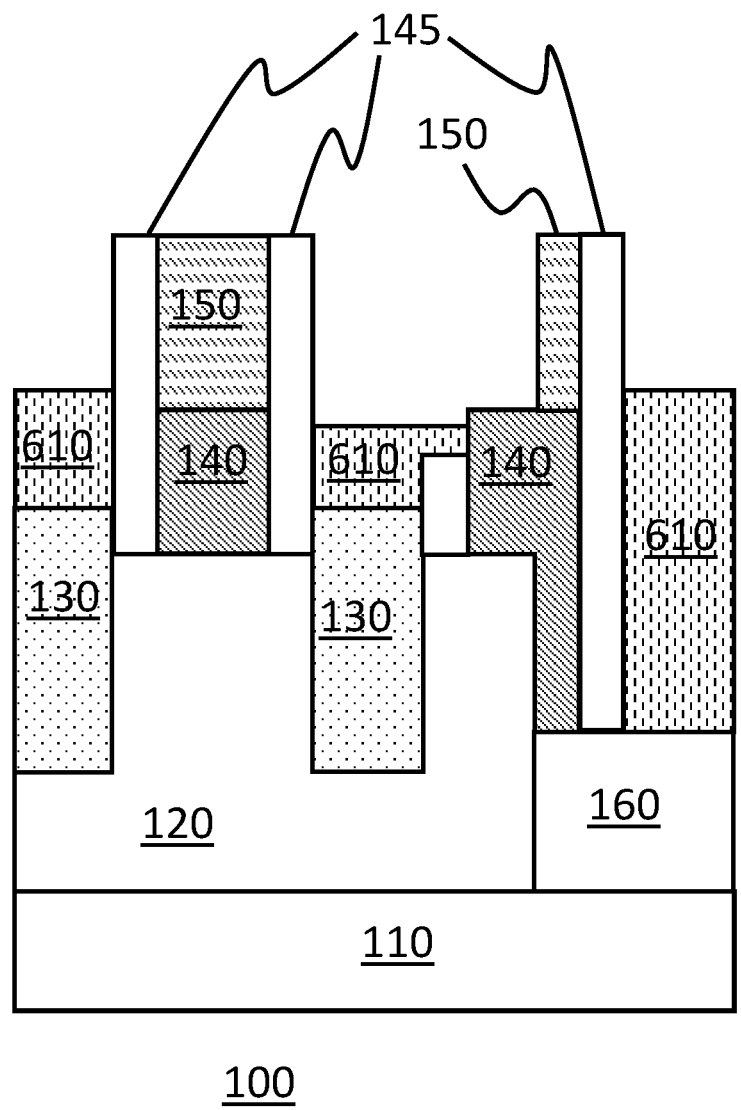
FIG. 7 provides a cross-sectional view of a step in the fabrication of a semiconductor device, according to an embodiment of the invention. The figure illustrates the device after recessing the trench silicide layer.

As shown in FIG. 7, etching recesses the metallized TS layer 610. Uneven etching due to etch loading and different trench widths, produces over etched, thin or weak XC connections between S-D region 130 and RMG structure 140 portions. In an embodiment, the recessed TS layer 610 has a thickness of between about 15 nm and about 30 nm.

Figure 8:
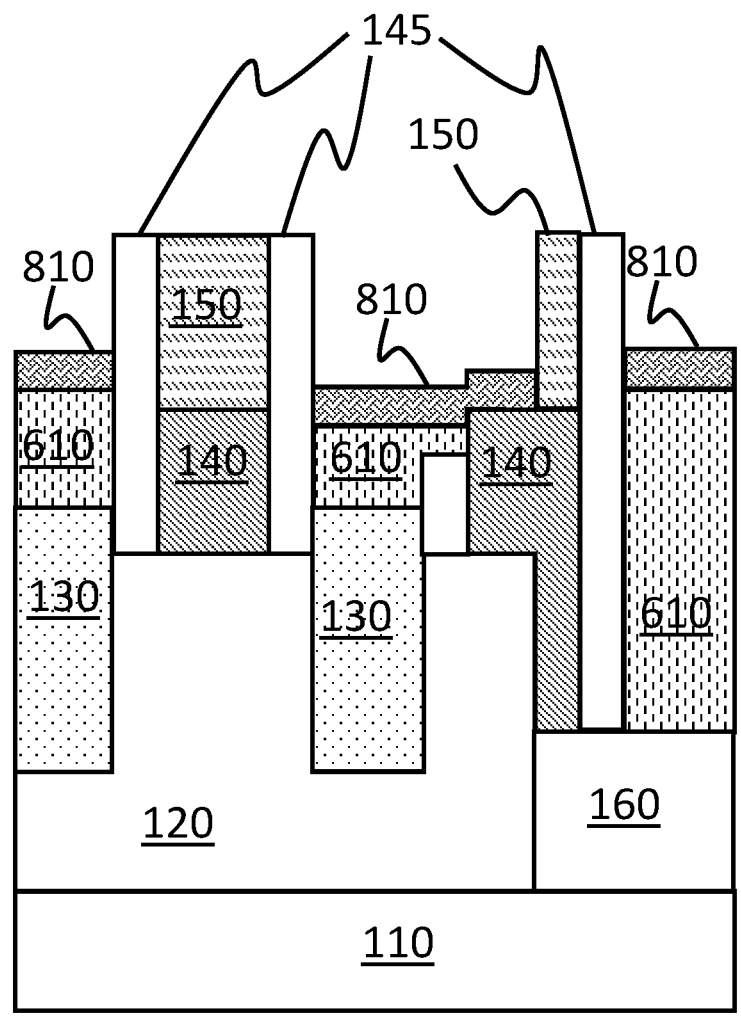
FIG. 8 provides a cross-sectional view of a step in the fabrication of a semiconductor device, according to an embodiment of the invention. The figure illustrates the device after the growth of a conductive layer over the recessed trench silicide layer.
Figure 9:
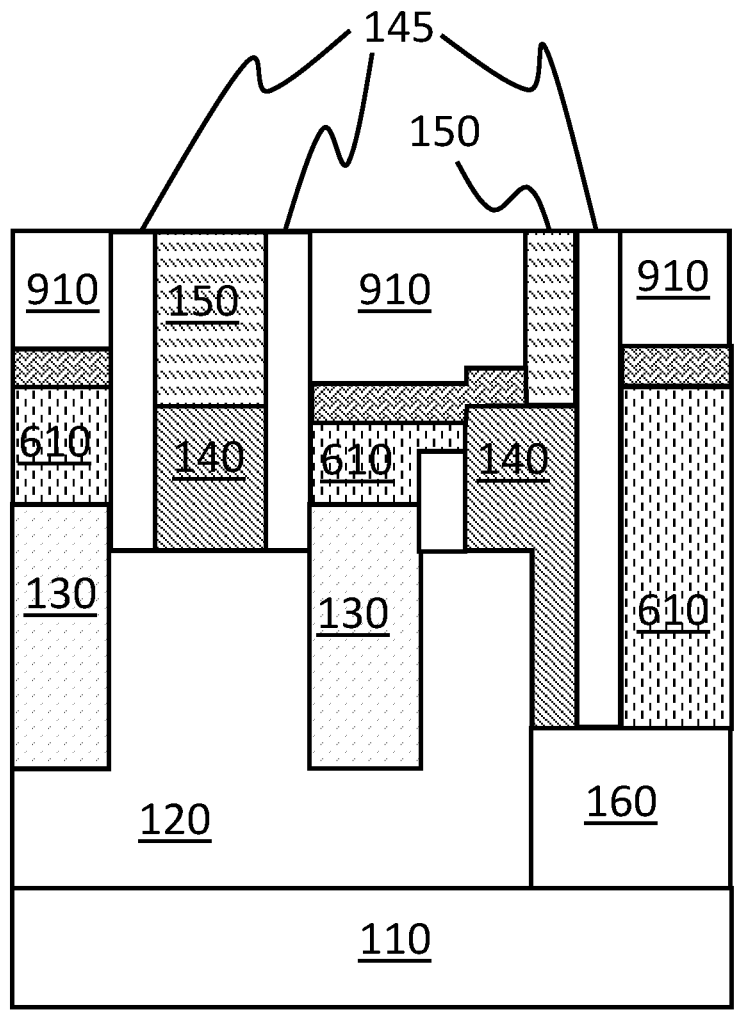
FIG. 9 provides a cross-sectional view of a step in the fabrication of a semiconductor device, according to an embodiment of the invention. The figure illustrates the device after the formation of a dielectric cap over the conductive layer.

As shown in FIG. 8, a second component 810, such as selectively grown tungsten, augments the thin CA-CB XC connection between CA (S-D region 130) and CB (RMG structure 140) portions, yielding a more robust CA-CB XC connection between these portions. In an embodiment, the selectively grown tungsten forming the second component 810 has a thickness of between about 3 nm, and about 10 nm. As shown in FIG. 9, deposition of a dielectric cap 910 covers and electrically isolates the CA-CB XC connection between the S-D region 130 and RMG structure 140 portions of the device.

Figure 10:
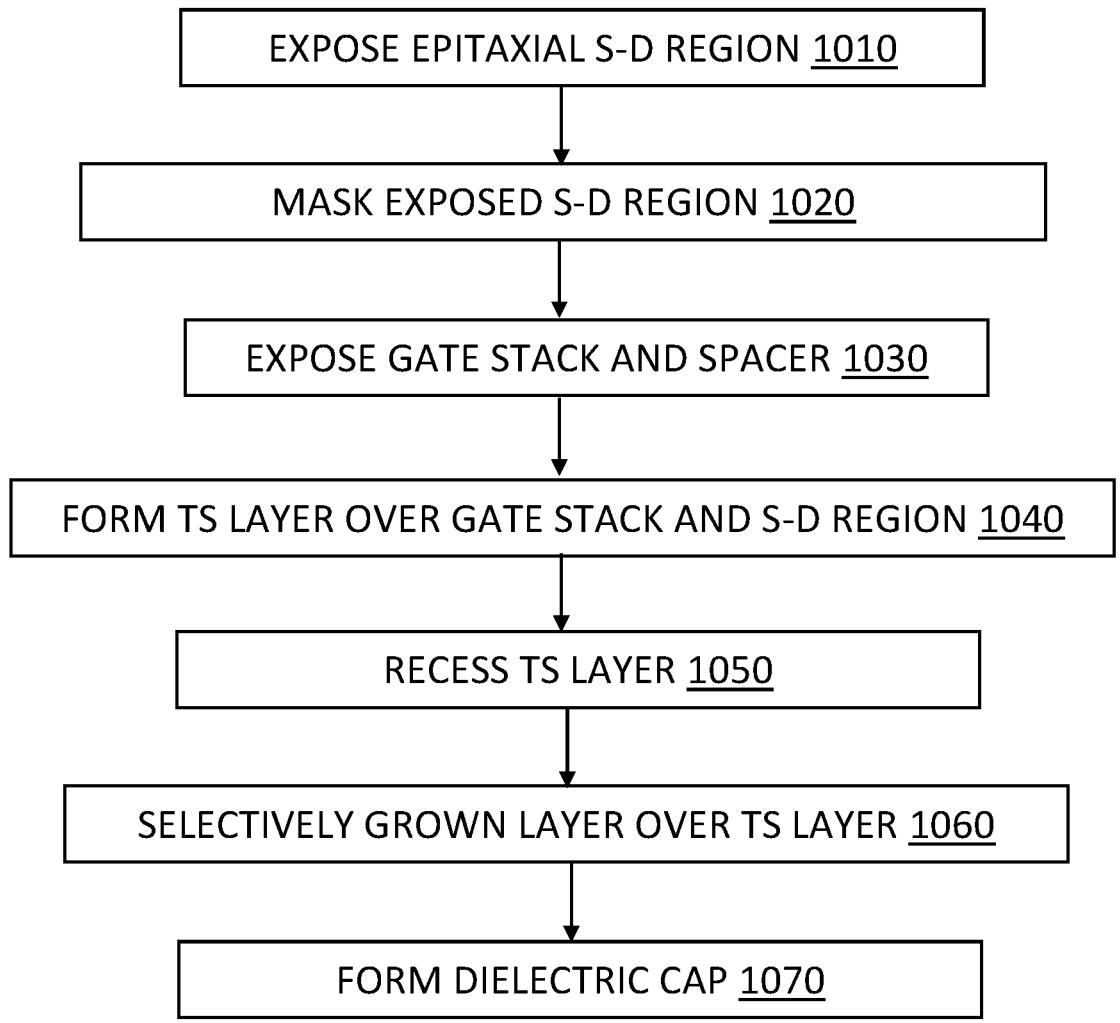
FIG. 10 provides a flowchart depicting operational steps for forming semiconductor device, according to an embodiment of the invention.

Flowchart 1000 of FIG. 10 sets forth fabrication steps according to an embodiment for creating devices according to an embodiment of the invention. As shown in the figure, at block 1010, epitaxially grown S-D regions are exposed by etching a trench to the level of the upper surface of the S-D regions. Wet or dry etching may be used to form the trench and expose the S-D regions without disturbing the RMG hard mask or protective sidewall spacers.

At block 1020, masking covers at least a portion of the S-D regions and leaves RMG hard mask, and sidewall spacers regions exposed. At block 1030, etching exposes the RMG gate metal and removes portions of the protective sidewall spacers. At block 1040 ashing removes the masking material prior to the deposition and formation of the TS layer and a metallized TS layer is formed over the S-D and gate metal regions. In an embodiment, the TS layer includes cobalt.

At block 1050, etching trims and recesses the TS layer. TS layer etching extents vary due to etch loading and trench-width dimensions. In an embodiment, etching recesses the TS layer below the upper surface of the gate metal reducing the contact area of the CA-CB XC connection. At block 1060 an upper conductive layer is selectively grown upon the upper surface of the TS layer and upon any exposed gate metal. In an embodiment, the upper conductive layer extends over S-D and gate metal regions of the device. In an embodiment, the supper conductive layer is selectively grown tungsten. At block 1070, deposition methods form a dielectric cap over the upper conductive and TS layers of the device. In an embodiment, the dielectric cap includes a nitride. Etching creates vias in the dielectric cap where S-D and gate contacts are formed. The device are then completed using standard back-end-of-line fabrication techniques.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising self-aligned gate contacts, the device including:
    an electrical connection between a device gate metal and a source-drain region, the electrical connection comprising a lower component disposed over the source-drain region and a recessed spacer region, and an upper component disposed over the device gate metal and the lower component; and
    a dielectric cap layer disposed adjacent to and above the upper component.

2. The semiconductor device according to claim 1 wherein the lower component comprises cobalt.

3. The semiconductor device according to claim 1, wherein the upper component comprises tungsten.

4. The semiconductor device according to claim 1, wherein the device gate comprises an upper surface disposed at a first height, the source-drain region comprises an upper surface disposed at a second height, and the first height is greater than the second height.

5. The semiconductor device according to claim 1, wherein the lower component is further disposed over the device gate metal.

6. The semiconductor device according to claim 1, further comprising a dielectric cap layer disposed adjacent to and above the upper component;
    wherein the device gate comprises an upper surface disposed at a first height, the source-drain region comprises an upper surface disposed at a second height, and the first height is greater than the second height; and
    wherein the lower component is further disposed over the device gate metal.

7. A method of fabricating a semiconductor device, the method comprising:
    forming a trench exposing an epitaxially grown source-drain region;
    masking at least a portion of the source-drain region;
    forming a gate trench exposing at least a portion of a device gate and gate spacer;
    forming a metallization layer between the source-drain region and the device gate;
    selectively recessing the metallization layer;
    forming a conductive layer upon the metallization layer; and
    forming a dielectric cap above the conductive layer.

8. The method of fabricating a semiconductor device according to claim 7, wherein the metallization layer comprises a trench silicide.

9. The method of fabricating a semiconductor device according to claim 7, wherein the metallization layer comprises cobalt.

10. The method of fabricating a semiconductor device according to claim 7, wherein the conductive layer comprises tungsten.

11. The method of fabricating a semiconductor device according to claim 7, wherein at least partially masking the source-drain region comprises forming a trench exposing a device gate hard mask and sidewall spacer.

12. The method of fabricating a semiconductor device according to claim 7, wherein the conductive layer is selectively grown.

13. The method of fabricating a semiconductor device according to claim 7, wherein the device gate comprises a high-k dielectric layer and a work function metal layer.

14. A method of fabricating a semiconductor device, the method comprising:
   forming a plurality of semiconductor fins upon a substrate;
   forming a plurality of epitaxially grown source-drain regions upon the fins;
   forming a plurality of device gates upon the fins, the device gates disposed between the epitaxially grown source-drain regions;
   forming a trench exposing at least one epitaxially grown source-drain region;
   masking at least a portion of the source-drain region;
   forming a gate trench exposing at least a portion of a device gate and gate spacer;
   forming a metallization layer between the source-drain region and the device gate;
   selectively recessing the metallization layer;
   forming a conductive layer upon the metallization layer; and
   forming a dielectric cap above the conductive layer.

15. The method of fabricating a semiconductor device according to claim 14, wherein the metallization layer comprises a trench silicide.

16. The method of fabricating a semiconductor device according to claim 14, wherein the metallization layer comprises cobalt.

17. The method of fabricating a semiconductor device according to claim 14, wherein the conductive layer comprises tungsten.

18. The method of fabricating a semiconductor device according to claim 14, wherein at least partially masking the source-drain region comprises forming a trench exposing a device gate hard mask and sidewall spacer.

19. The method of fabricating a semiconductor device according to claim 14, wherein the conductive layer is selectively grown.

* * * * *